United States Patent [19]

Ahmed

[11] 4,270,101
[45] May 26, 1981

[54] RELAXATION OSCILLATOR HAVING SWITCHED CURRENT SOURCE

[75] Inventor: Adel A. A. Ahmed, Clinton Township, Mercer County, N.J.

[73] Assignee: RCA Corporation, New York, N.Y.

[21] Appl. No.: 4,843

[22] Filed: Jan. 19, 1979

[51] Int. Cl.³ .................. H03K 3/82; H03K 3/352
[52] U.S. Cl. ............................ 331/111; 307/252 R
[58] Field of Search ............... 331/107 R, 111, 143; 332/16 T, 14; 307/252 B, 252 F, 252 R

[56] References Cited

U.S. PATENT DOCUMENTS

| | | | |
|---|---|---|---|
| 3,737,731 | 6/1973 | Zeewy | 331/111 |
| 3,872,405 | 3/1975 | Gotou et al. | 331/111 |
| 4,001,723 | 1/1977 | Sheng et al. | 331/111 |

OTHER PUBLICATIONS

Hunt, "Laser Diodes Need High-Current Drivers", Electronic Design, Sep. 27, 1970, pp. 50, 51.

*Primary Examiner*—Siegfried H. Grimm
*Attorney, Agent, or Firm*—E. M. Whitacre; P. J. Rasmussen; J. M. O'Meara

[57] ABSTRACT

Within a relaxation oscillator of the type having a capacitor that is recurrently charged from a current source and then discharged through a silicon controlled rectifier upon reaching a threshold voltage thereacross, a switch is disposed to interrupt current flow between the current source and the capacitor whenever the SCR is conductive.

11 Claims, 2 Drawing Figures

RELAXATION OSCILLATOR HAVING SWITCHED CURRENT SOURCE

The present invention relates to an oscillator circuit of the type wherein a capacitor is recurrently charged from a current source and then discharged through a silicon controlled rectifier (SCR) upon reaching a threshold voltage thereacross.

Although relaxation oscillators of this type are well known in the art, such oscillators are operationally limited. The current source must supply the latching current required to render the SCR conductive so that the capacitor can be discharged. If the SCR is to become non-conductive after the capacitor has been discharged, however, the magnitude of the current source must not exceed the holding current requirement of the SCR. Generally, the difference in magnitude between the latching and holding currents of the SCR is not very great. Therefore, the magnitude of the current source is limited to a narrow range, particularly when allowance is made for tolerance to consider normal variations in the characteristics of the SCR. Consequently, the value of the capacitor is essentially selected in accordance with the oscillation frequency desired, rather than in accordance with other practical considerations. For example, at high operating frequencies it may be desirable to use a capacitor of sufficiently large value to swamp out the effects of stray capacitance. Where a resistor is connected from a supply rail to provide the current source, another problem is presented when little difference exists between the latching and holding currents of the SCR. This is so because the available voltage drop across the resistor is low when a large current is desired to render the SCR conductive but high when a small current is desired to render the SCR non-conductive. These conflicting conditions operate to restrict the permissible oscillation amplitude.

The relaxation oscillator of this invention overcomes this operational limitation by interrupting current flow between the current source and the capacitor whenever the SCR is conductive. In one preferred embodiment, the current flow interruption is accomplished through a switching circuit which includes a bipolar transistor having its main conduction path disposed to conduct current from the current source to the capacitor and a voltage offset means for biasing the base-emitter junction of the transistor in a forward or reverse direction when the SCR is non-conductive or conductive respectively.

Figure 1:
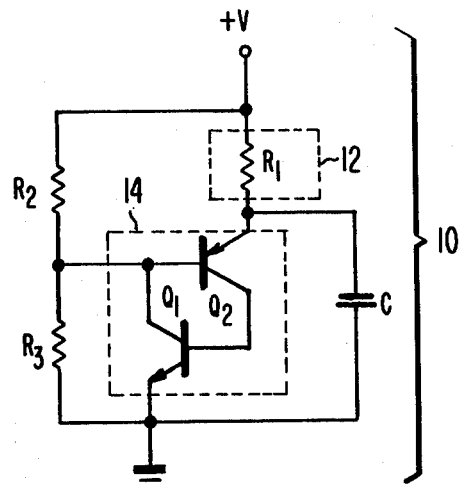
FIG. 1 is a schematic of a prior art relaxation oscillator.

The prior art relaxation oscillator 10 of FIG. 1 includes a capacitor C which is recurrently charged by a current source 12 and then discharged through an SCR 14 upon reaching a threshold voltage thereacross. Of course, the voltage across C is proportional to the level of charge stored therein as stated by Coulomb's Law. Resistor $R_1$ is connected from a rail voltage $+V$ as the current source 12, while bipolar transistors $Q_1$ and $Q_2$ of complementary types are connected in a conventional manner as the SCR 14. A voltage divider including resistors $R_2$ and $R_3$ is connected between $+V$ and a reference rail voltage such as ground to apply a bias voltage to the negative gate of the SCR 14 which is then commonly known as a programmable unijunction transistor or silicon controlled switch (see U.S. Pat. No. 4,001,723). Of course, the bias voltage could be applied to the positive gate of the SCR 14 at the base of $Q_1$ where a negative rail voltage is more convenient. Charge is supplied to C by the current source 12 until the voltage thereacross increases sufficiently to forward bias the base-emitter junction of $Q_2$, which functions as the gate control junction of the SCR 14. Then the latching current is drawn through the main conduction path of $Q_2$ and $Q_1$ becomes sufficiently conductive to pull down the base of $Q_2$ and thereby establish the regenerative loop necessary to render the SCR 14 conductive across C. Thereafter C discharges until the current being drawn through the main conduction path of $Q_2$ falls below the holding level that is necessary to maintain conduction about the regenerative loop. Consequently, the SCR 14 becomes substantially non-conductive and charge is once again directed to C by the current source 12 to commence another oscillation cycle. The magnitude of the current source 12 is, of course, limited by the latching and holding current requirements of the SCR 14. Therefore, the frequency attainable from the relaxation oscillator 10 is substantially determined by the value of C which may present the difficulties discussed previously.

Figure 2:
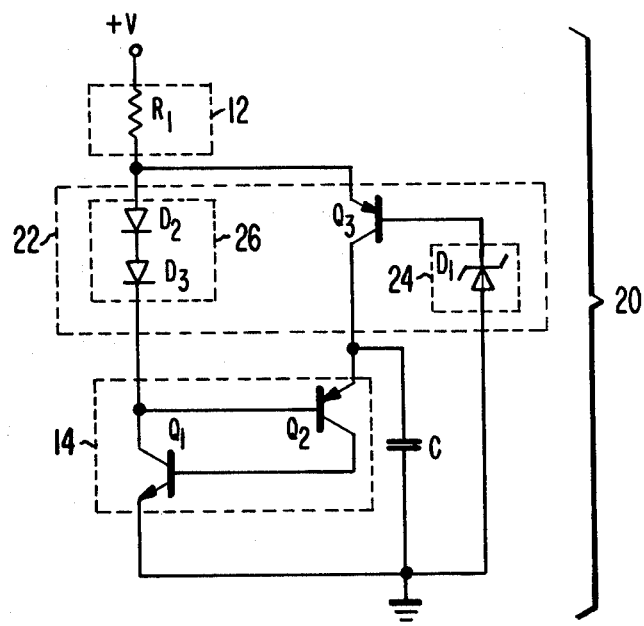
FIG. 2 is the block diagram for the relaxation oscillator of the invention, and also the schematic diagram for the preferred embodiments thereof.

The relaxation oscillator 20 of this invention is shown in the block diagram of FIG. 2 wherein the current source 12, the SCR 14, and the capacitor C from the relaxation oscillator 10 of FIG. 1 are utilized. A switch means 22 is disposed in relaxation oscillator 20 for interrupting current flow between the current source 12 and C whenever the SCR 14 is conductive. Relaxation oscillator 20 operates in the same manner as the relaxation oscillator 10 of FIG. 1, except that no charge flows between the current source 12 and C, when the SCR 14 is conductive to discharge C. Therefore, the holding current for the SCR 14 is only supplied by C and the current source 12 may be increased in magnitude beyond the holding current magnitude to determine the oscillation frequency.

Although many embodiments of the switch means 22 are possible, FIG. 2 shows one preferred embodiment thereof which includes a bipolar transistor $Q_3$ having its main conduction path disposed to conduct the current from the current source 12 to C. A voltage offset means for biasing the base-emitter junction of $Q_3$ in a forward (conductive) or reverse (non-conductive) direction when the SCR 14 is non-conductive or conductive respectively, is also included in this embodiment. The relaxation oscillator 20 then operates with the main conduction path of $Q_3$ being controlled by the voltage offset means in response to the conductive condition of SCR 14. During each oscillation cycle, C is charged through the main conduction path of $Q_3$ by the current source 12 until the gate control junction of SCR 14 becomes forward biased in that it is no longer reversed biased. This renders SCR 14 conductive and the voltage offset means responds to render $Q_3$ non-conductive. The SCR 14 remains conductive until its holding current is not sustained by the discharging of C. Then SCR 14 is rendered non-conductive and the voltage offset means responds to render $Q_3$ conductive, which thereby commences another oscillation cycle.

The voltage offset means may also have many embodiments within the switch means 22 and FIG. 2 shows one such embodiment that includes a means 24 for applying a bias voltage to the base of $Q_3$ and means 26 for dropping the voltage between the gate of the SCR 14 and the output of the current source 12. The magnitude of the bias voltage means 24 is fixed to forward bias the base-emitter junction of $Q_3$ when the SCR is non-conductive while the magnitude of the voltage dropping means 26 is fixed to forward bias the gate control junction within the SCR 14 when the threshold voltage of the capacitor C is reached. The output voltage of the current source 12 is pulled down by current flow through the voltage dropping means 26 and the main conduction path of $Q_1$ when the SCR 14 becomes conductive. The gate control junction of SCR 14 then becomes latched with a forward bias in a manner similar to that explained previously for the prior art, while the base-emitter junction of $Q_3$ simultaneously becomes reverse biased. Thereafter, the conductive path between the current source 12 and C is interrupted through $Q_3$ but SCR 14 is conductive so that C is being discharged. When the voltage across C decreases to where current flow through the SCR 14 falls below the holding level necessary to sustain conduction therethrough, the output voltage of current source 12 is pulled up simultaneously with the gate of SCR 14 and $Q_3$ again becomes conductive to charge C while SCR 14 is non-conductive.

A particular circuit embodiment for the voltage offset means is shown in FIG. 2 wherein an avalanche diode $D_1$ is connected between the base of $Q_3$ and ground as the bias voltage means 24, while diodes $D_2$ and $D_3$ are series connected as the voltage dropping means 26. Assuming that this circuitry is constructed from a basic semiconductor material on a monolithic chip, the forward bias conduction voltage across the junction of either $D_2$ or $D_3$ will be substantially the same as the forward biased conduction voltage ($V_{be}$) across the base-emitter junction of $Q_3$. Consequently, the voltage impressed on the gate of the SCR 14 is one $V_{be}$ less than the avalanche level of $D_1$ when $Q_3$ becomes conductive to start the charging of C and the threshold voltage of C at which SCR 14 becomes conductive is substantially equal to the avalanche level of $D_1$. Furthermore, the frequency of the oscillator 20 is directly related to the magnitude of the voltage dropping means 26 and inversely related to the magnitude of the bias voltage means 24. Therefore, other circuit components such as resistors, zener diodes, or avalanche diodes could be combined within the voltage dropping means 26 to determine the frequency of the relaxation oscillator 20. Also, other circuit arrangements could be utilized for the bias voltage means 24 to determine the oscillation frequency, such as a voltage divider; or a source of changing bias voltage could be utilized where one wishes to modulate the oscillator frequency.

Although this invention has been disclosed herein by describing only a few embodiments thereof, it should be understood by those skilled in the art that numerous changes in the details of construction and the combination or arrangement of parts could be made in the described embodiments without departing from the true scope and spirit of the invention. Therefore, the present disclosure should be construed as illustrative rather than limiting.

What I claim is:

1. In a relaxation oscillator of the type including a capacitor having a first plate connected to a reference potential, and having a second plate, means for supplying current of a first polarity to a first node connected at least at selected times to the second plate of the capacitor for charging the capacitor, and an SCR having a main conducting path connected across the capacitor for discharging the capacitor responsive to the voltage thereacross reaching a threshold voltage level, and having a gate electrode at which there is a demand for gate current of said first polarity when the SCR is conductive, the improvement comprising:

means connecting the gate electrode of the SCR to the first node, for diverting substantially all the current supplied by the means for supplying current to the gate electrode of the SCR when the SCR is conductive;

a transistor having output and common electrodes with a main-conduction path therebetween, and having an input electrode, the output electrode connecting to the second plate of the capacitor and the common electrode connecting to the first node; and means for applying a bias voltage to the input electrode of said transistor, which bias voltage is unidirectional with respect to the reference potential and is not related to the conduction of the SCR through its main conduction path, for conditioning said transistor for conduction and nonconduction responsive to the gate electrode current of the SCR when the SCR is nonconductive and conductive, respectively.

2. The relaxation oscillator of claim 1 wherein said means connecting the gate electrode of the SCR to the first node includes voltage dropping means connected between the common electrode of said transistor and the gate electrode of the SCR.

3. The relaxation oscillator of claim 2 wherein said voltage dropping means includes a plurality of serially-connected diode means poled to conduct the SCR gate current in the forward direction, connected between the first node and the gate electrode of the SCR.

4. The relaxation oscillator of claim 3 wherein said plurality of serially-connected diode means is of predetermined number, having forward conduction voltages preselected for making the voltage threshold level substantially equal to said bias voltage.

5. The relaxation oscillator of claim 1 wherein said bias voltage is an offset potential of substantially constant magnitude, at least during conduction of said transistor.

6. The relaxation oscillator of claim 5 wherein said offset potential is supplied by an avalanche diode.

7. In a relaxation oscillator of the type including a capacitor having a first plate connected to a reference potential, and having a second plate, means for supplying current to a first node connected at least at selected times to the second plate of the capacitor for charging the capacitor, and first and second transistors of complementary conductivity types having respective collector electrodes, having respective base electrodes each connected to the collector electrode of the other transistor, and having respective emitter electrodes connected to the first plate of the capacitor and to its second plate, the improvement comprising:

a third transistor of like conductivity type to that of the second transistor, having an emitter electrode connected to the first node, having a collector electrode connected to the second plate of the capacitor, and having a base electrode;

means for applying a bias voltage unrelated to the conduction of the second transistor to the base electrode of said third transistor; and voltage dropping means connected between the first node and the collector electrode of the first transistor for conducting the current from said means for supplying current to reverse bias the base-emitter junction of said third transistor when the first transistor is conductive.

8. The relaxation oscillator of claim 7 wherein said voltage dropping means includes a plurality of serially-connected diode means poled for forward conduction of the collector current of the first transistor, connected between the emitter electrode of said third transistor and the collector electrode of the first transistor.

9. The relaxation oscillator of claim 8 wherein said plurality of serially-connected diode means is of predetermined number, having forward conduction voltages preselected for making the capacitor voltage at which the second transistor becomes conductive substantially equal to said bias voltage.

10. The relaxation oscillator of claim 7 wherein said bias voltage is an offset potential of substantially constant magnitude at least during conduction of said third transistor.

11. The relaxation oscillator of claim 10 wherein said offset potential is supplied by an avalanche diode.

* * * * *

UNITED STATES PATENT AND TRADEMARK OFFICE
CERTIFICATE OF CORRECTION

PATENT NO. : 4,270,101
DATED : May 26, 1981
INVENTOR(S) : Adel A. A. Ahmed

It is certified that error appears in the above—identified patent and that said Letters Patent is hereby corrected as shown below:

ON ABSTRACT SHEET:

Item [75] delete "Mercer County".

Column 4, Line 5 (Claim 1) - "conducting" should be -- conduction --.

Signed and Sealed this

Fifteenth Day of December 1981

[SEAL]

Attest:

Attesting Officer

GERALD J. MOSSINGHOFF

Commissioner of Patents and Trademarks